(12) United States Patent
Kwon

(10) Patent No.: US 8,864,527 B2
(45) Date of Patent: Oct. 21, 2014

(54) UNIVERSAL SERIAL BUS MEMORY DEVICE AND METHOD OF MANUFACTURING THE SAME

(71) Applicant: Byoung Jin Kwon, Seoul (KR)

(72) Inventor: Byoung Jin Kwon, Seoul (KR)

(*) Notice: Subject to any disclaimer, the term of this patent is extended or adjusted under 35 U.S.C. 154(b) by 70 days.

(21) Appl. No.: 13/727,441

(22) Filed: Dec. 26, 2012

(65) Prior Publication Data

US 2013/0171875 A1 Jul. 4, 2013

(30) Foreign Application Priority Data

Dec. 28, 2011 (KR) .................. 10-2011-0144536

(51) Int. Cl.
*H01R 25/00* (2006.01)
*H05K 13/00* (2006.01)
*G06F 1/26* (2006.01)

(52) U.S. Cl.
CPC *G06F 1/26* (2013.01); *H05K 13/00* (2013.01); *Y10S 439/955* (2013.01)
USPC .......................................... 439/638; 439/955

(58) Field of Classification Search
USPC .......... 439/188, 159, 160, 152–155, 638, 955
See application file for complete search history.

(56) References Cited

U.S. PATENT DOCUMENTS

| 6,761,580 | B2* | 7/2004 | Chang | 439/502 |
| 6,780,048 | B2* | 8/2004 | Chen et al. | 439/502 |
| 7,083,451 | B2* | 8/2006 | Zhu et al. | 439/188 |
| 7,356,715 | B2* | 4/2008 | Okayasu | 713/300 |
| 7,997,937 | B2* | 8/2011 | Kondo | 439/660 |
| 8,235,746 | B2* | 8/2012 | He | 439/502 |
| 8,398,314 | B2* | 3/2013 | Ko et al. | 385/93 |
| 2004/0029421 | A1* | 2/2004 | Yen | 439/79 |
| 2013/0237080 | A1* | 9/2013 | Li et al. | 439/345 |

* cited by examiner

*Primary Examiner* — Neil Abrams
*Assistant Examiner* — Phuongchi T Nguyen
(74) *Attorney, Agent, or Firm* — Novick, Kim & Lee, PLLC; Jae Youn Kim

(57) ABSTRACT

Disclosed are a universal serial bus (USB) memory device having a 5 pin USB connector which may be directly used for a portable terminal and a method of manufacturing the same. The USB memory device includes: at least one 5 pin USB connector; a memory to write data received from the 5 pin USB connector or reading out stored data to transmit the data to the 5 pin USB connector; and a controller electrically connected to the 5 pin USB connector and the memory to control data transmission between the 5 pin USB connector and the memory, wherein the 5 pin USB connector comprises a power terminal, a ground terminal, a D+ terminal, a D− terminal, and an ID terminal, and the ID terminal is connected to the ground terminal so that the 5 pin USB connector is grounded.

4 Claims, 3 Drawing Sheets

US 8,864,527 B2

UNIVERSAL SERIAL BUS MEMORY DEVICE AND METHOD OF MANUFACTURING THE SAME

BACKGROUND OF THE INVENTION

1. Field of the Invention

The present invention relates to a universal serial bus (hereinafter referred to as 'USB') memory device having a 5 pin USB connector. More particularly, the present invention relates an USB memory device which may be directly used in various types of 5 pin US port portable (mobile) terminals including a smart phone and a smart pad and a method of manufacturing the same.

The present invention also relates to an USB memory device which includes a 5 pin USB connector provided at one side thereof and a 4 pin USB connector provided at the other side thereof such that the USB memory device can be connected to a PC type 4 pin USB port, such as a desk top computer, as well as various types of portable terminals to facilitate memory storage and data transmission between terminals of different pin types, and a method of manufacturing the same.

2. Description of the Related Art

A USB refers to one of bus standards used for data communication between a computer and a peripheral device. A USB memory device is a portable storage device using a flash memory inserted into a USB port, and acquires data from various electronic devices, such as a PC supporting a USB protocol, so that a user may reuse the data.

However, since a USB memory device according to the related art includes a 4 pin USB connector, the USB memory device is not suitable for a mobile terminal using a 5 pin USB port, such as a mini type port or a micro type port.

In order to solve this problem, as shown in FIG. 1, a USB host cable 10 according to the related art has been developed in which a 4 pin USB is provided at one end of the USB host cable 10 and a 5 pin USB connector is provided at an opposite end of USB host cable 10 so that a USB memory device can be connected to a mobile terminal.

However, the related art has a limitation in that a separate cable is required to connect the USB memory device to the portable terminal.

Accordingly, the development of a USB memory device which can be directly used in a portable terminal is needed.

Since the USB memory device according to the related art is not suitable for the portable terminal, although data transfer can be freely achieved between PCs using only the USB memory device, there is a limitation in data transfer between the PC and the portable terminal using only the USB memory device. To transfer data between the PC and the portable terminal, there is needed a cable provided at one side thereof with a 4 pin USC connector and at the other side thereof with a 5 pin USB connector.

Accordingly, the development of a USB memory device available in both of the PC and the portable terminal is required.

SUMMARY OF THE INVENTION

Accordingly, the present invention has been made keeping in mind the above problems occurring in the prior art, and an object of the present invention is to provide a USB memory device having a 5 pin USB connector which may be directly used for a portable terminal.

Another object of the present invention is to provide a USB memory device having both a 5 pin USB connector and a 4 pin USB connector, which is applicable to both of a PC and a portable terminal to freely transfer data between the PC and the portable terminal.

To accomplish these objects, according to one aspect of the present invention, there is provided a universal serial bus (USB) memory device including: at least one 5 pin USB connector; a memory to write data received from the 5 pin USB connector or reading out stored data to transmit the data to the 5 pin USB connector; and a controller electrically connected to the 5 pin USB connector and the memory to control data transmission between the 5 pin USB connector and the memory, wherein the 5 pin USB connector comprises a power terminal, a ground terminal, a D+ terminal, a D− terminal, and an ID terminal, and the ID terminal is connected to the ground terminal so that the 5 pin USB connector is grounded.

The power terminal of the 5 pin USB connector may be electrically connected to a power control terminal of the controller, the D+ terminal of the 5 pin USB connector may be electrically connected to a D− control terminal of the controller, the D− terminal of the 5 pin USB connector may be electrically connected to a D+ control terminal of the controller, and the ground terminal and the ID terminal of the 5 pin USB connector may be electrically connected to a ground control terminal of the controller, respectively.

The universal serial bus memory device may further include at least one 4 pin USB connector including a second power terminal, a second ground terminal, a second D+ terminal, and a second D− terminal, wherein the 4 pin USB connector is electrically connected to the controller so that data transmission from the memory is controlled by the controller.

The 4 pin USB connector may be electrically connected to an electrical connection node between the 5 pin USB connector and the controller 120.

According to another aspect of the present invention, there is provided a method of manufacturing a universal serial bus (USB) memory device, the method including: forming a 5 pin USB connector including a power terminal transferring $V_{CC}$ power, a ground terminal transferring a ground signal, a D+ terminal and a D− terminal transferring a data signal, and an ID terminal selectively transferring a client signal and a host signal to an external device, and transferring a signal in such a manner that an external device connected to the 5 pin USB connector is recognized as a client when the ID terminal is connected to the ground terminal so that the 5 pin USB connector is open without being connected to a mobile terminal, and transferring a signal in such a manner that the external device connected to the 5 pin USB connector is recognized as a host when the 5 pin USB connector is shorted with the mobile terminal; forming a controller configured to manage data input/output of the memory while controlling an operating system of the portable terminal connected to the 5 pin USB connector to recognize a USB memory device, and electrically connected to the 5 pin USB connector and the memory to controls data transmission between the 5 pin USB connector and the memory; forming a memory configured to write data from the 5 pin USB connector or read out stored data to transmit the data to the 5 pin USB connector, freely store or delete data, and maintain the data even if power is turned off.

The 5 pin USB may be electrically connected to the controller in such a manner that the power terminal of the 5 pin USB connector is electrically connected to a power control terminal of the controller, the D+ terminal of the pin USB connector is electrically connected to a D− control terminal of the controller, the D− terminal of the pin USB connector is electrically connected to a D+ control terminal of the controller, and the ground terminal and the ID terminal of the 5 pin USB connector are electrically connected to a ground control terminal of the controller, respectively.

The method may further include forming a 4 pin USB connector including a second power terminal, a second ground terminal, a second D+ terminal, and a second D− terminal, and wherein the 4 pin USB connector may be electrically connected to the controller so that data transmission from the memory is controlled by the controller.

The controller may control data transmission between the 4 pin USB connector and the memory or controls the memory to record and store data from the 4 pin USB connector, the power terminal of the 4 pin USB connector may be electrically connected to a connection node between the power terminal of the 5 pin USB connector and the power control terminal of the controller, the D+ terminal of the pin USB connector may be electrically connected to a connection node between the D+ terminal of the 5 pin USB connector and the D− control terminal of the controller, the D− terminal of the 4 pin USB connector may be electrically connected to a connection node between the D− terminal of the 5 pin USB connector and the D− control terminal of the controller, and the ground terminal of the 4 pin USB connector may be electrically connected to a connection node between the ground terminal of the 5 pin USB connector and the ground control terminal of the controller.

As described above, since the USB memory device according to the present invention may be directly connected to the mobile terminal, the USB memory device can receive and store data from the mobile terminal without a separate cable or auxiliary device.

That is, since the USB memory device of the present invention may be directly connected to the separate cable or auxiliary device, only the USB memory device can store data of the mobile terminal and transfer the data of the mobile terminal to other mobile terminals.

In addition, the USB memory device may include not only the first USB connector suitable for the mobile terminal, but also the second USB connector suitable for the PC, data transfer between the PC and the mobile terminal can be achieved only using the USB memory device.

DETAILED DESCRIPTION OF THE INVENTION

Hereinafter, exemplary embodiments of the present invention will be described in detail with reference to accompanying drawings. However, the present inventive concept may be embodied in many different forms and should not be limited to the embodiments set forth herein.

Accordingly, the present invention is not limited to the specific embodiment, but the embodiment includes all modifications, equivalents, and substitutes belonging to the technical scope of the embodiment without departing from the spirit of the embodiment.

The same reference numbers are used throughout the drawings to refer to the same or like parts.

Figure 1:
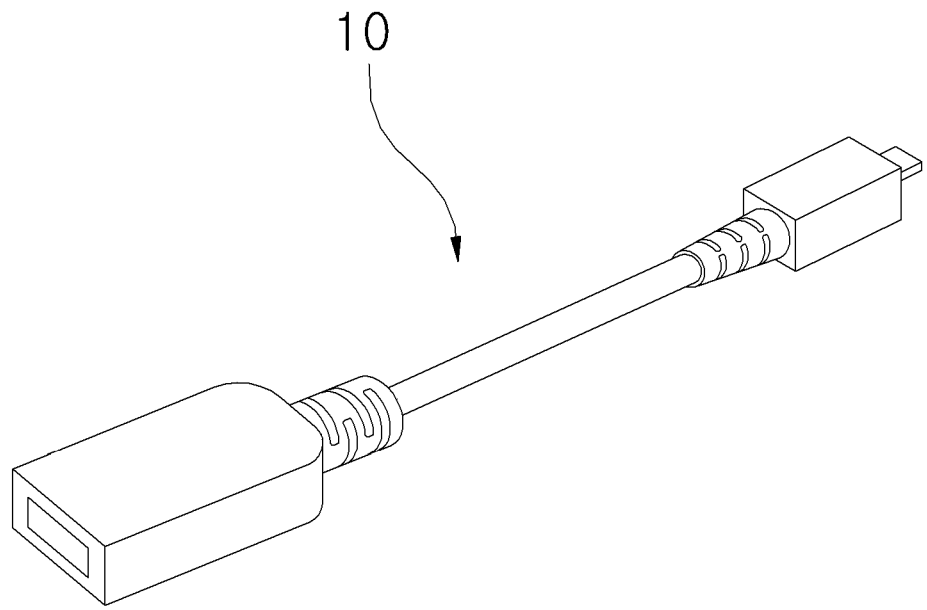
FIG. 1 is a perspective view illustrating a configuration of a USB host cable according to the related art.
Figure 2:
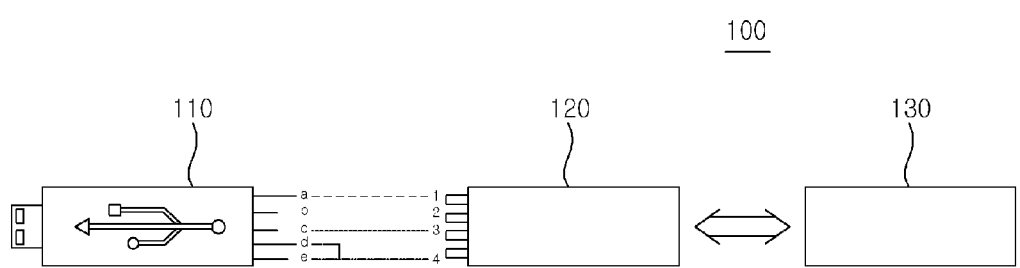
FIG. 2 is a view illustrating constituent elements of a USB memory device and connection relationship of the constituent elements according to an embodiment of the present invention.

FIG. 2 is a view illustrating constituent elements of a USB memory device and connection relationship between the constituent elements according to an embodiment of the present invention.

As shown in FIG. 2, the USB memory device 100 of the present invention is provided with at least one 5 pin USB connector 110, and a memory 130 and a controller 120 are electrically communicated with the 5 pin USB connector 110.

In detail, the 5 pin USB connector 110 is connected to a USB port of a mobile terminal having a 5 pin USB port to input/output data. The mobile terminal having the 5 pin USB port includes a controller controlling and managing USB transmission on a bus by an operation program supporting a USB standard protocol and being set in a host mode or a client mode, and the 5 pin UBS port for connecting a peripheral device of a USB standard.

For reference, the USB port of the mobile terminal corresponds to the USB connector of the USB memory. If the USB connector is a male connector, the USB port may be a female connector.

The 5 pin USB connector 110 includes a power terminal a, a D− terminal b, a D+ terminal c, an identification (ID) terminal d, and a ground terminal e, and functions of the power terminal a, the D− terminal b, the D+ terminal c, the ID terminal d, and the ground terminal e will be described in a following table 1. The ID terminal d is connected and shorted with the ground terminal e so that a controller of the mobile terminal is activated by a host controller.

This is because a signal is transferred so that an external device connected to the USB connector is recognized as a client when the ID terminal d is open without being connected to the ground terminal e, and the signal is transferred so that the external device connected to the USB connector is recognized as a host when the ID terminal d is shorted.

TABLE 1

| Terminal name | Function |
| --- | --- |
| Power terminal | Transfer $V_{cc}$ power |
| D− terminal | Transfer data signal |
| D+ terminal | Transfer data signal |
| ID terminal | Transfer client/host signals to external device |
| Ground terminal | Transfer ground signal |

Meanwhile, the memory 130 writes and reads data. In detail, the memory 130 writes data received from the 5 pin USB connector or reads out stored data and transfers the read data to the 5 pin USB connector.

It is preferable that the memory 130 may freely store or remove data, and maintain the data even at power-off. For example, the memory 130 may include a flash memory.

Meanwhile, the controller 120 controls an operating system of the portable terminal connected to the 5 pin USB connector 110 to recognize a USB memory device, and manages data input/output of the memory 130. In detail, the controller 120 is electrically connected to the 5 pin USB connector 110 and the memory 130 and controls data transmission between the 5 pin USB connector 110 and the memory 130.

Referring to FIG. 2, the 5 pin USB connector 110 is electrically connected to the controller 120.

In this case, the power terminal a of the 5 pin USB connector 110 is electrically connected to a power control terminal 1 of the controller 120, the D− terminal b of the 5 pin USB connector 110 is electrically connected to a D+ control terminal 3 of the controller 120, a D+ terminal of the 5 pin USB connector 110 is electrically connected to a D− control terminal 2 of the controller 120, and the ID terminal d and the ground terminal e of the 5 pin USB connector are electrically connected to a ground control terminal 4 of the controller 120, respectively.

Particularly, the D+ terminal c and the D− terminal b of the 5 pin USB connector 110 are electrically connected to the D− control terminal 2 and the D+ control terminal 3 of the controller 120, respectively, and transmit data from the USB connector 110 to the controller 120.

Accordingly, the control of data transmission by the controller 120 will be described in detail. The D− control terminal 2 and the D+ control terminal 3 of the controller 120 are electrically connected to the D+ terminal c and the D− terminal b of the 5 pin USB connector 110, respectively.

In this case, the controller 120 may receive data from the 5 pin USB connector 110, and transmits the received data to the memory 130 to control so that the data are recorded in the memory 130. To the contrary, the controller 120 may reads out data stored in the memory 130 to control so that the data are transmitted to the 5 pin USB connector 110.

Since the USB memory device 100 according to the embodiment of the present invention mentioned above is suitably used for the mobile terminal having the 5 pin USB port and may be directly connected to the mobile terminal, the USB memory device may receive and store the data from the mobile terminal without a separate cable or auxiliary device.

Further, the USB memory device 100 according to the embodiment of the present invention may store data of the mobile terminal and transfer the data to other mobile terminals using only the USB memory device without the separate cable or auxiliary device.

Figure 3:
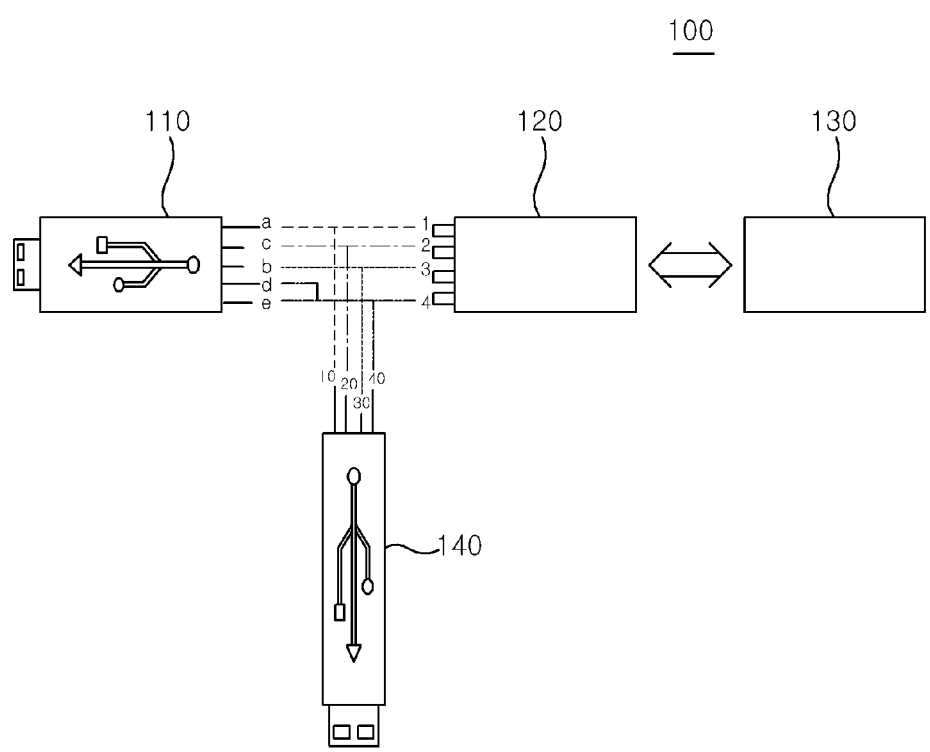
FIG. 3 is a view illustrating constituent elements of a USB memory device and connection relationship of the constituent elements according to another embodiment of the present invention.

FIG. 3 is a view illustrating constituent elements of a USB memory device and connection relationship between the constituent elements according to another embodiment of the present invention.

Referring to FIG. 3, the USB memory device according to another embodiment of the present invention may further include at least one 4 pin USB connector 140 having a second power terminal 10, a second D+ terminal 20, a second D− terminal 30, and a second ground terminal 400 in addition to the configuration of the USB memory device according to the embodiment of the present invention.

That is, the USB memory device 100 may be used not only for a mobile terminal having a 5 pin USB port, but also for a PC by further including the 4 pin USB connector 140 suitable for a PC.

The 4 pin USB connector 140 is electrically connected to the controller 120 so that data transmission is controlled between the 4 pin USB connector 140 and the memory 130 by the controller 120.

Thus, the controller 120 can control data transmission between the 5 pin USB connector 110 and the memory 130 and data transmission between the 4 pin USB connector 140 and the memory 130, and the memory 130 can record data from the 4 pin USB connector 140 and can transmit stored data to the 4 pin USB connector 140.

Referring to FIG. 3, an electrical connection configuration between the 4 pin USB connector 140 and the controller 120 will be described in detail below. The 4 pin USB connector 140 may be electrically connected to an electrical connection node between the 5 pin USB connector 110 and the controller 120.

In detail, a second power terminal 10 of the 4 pin USB connector is electrically connected to a connection node between the power terminal a of the 5 pin USB connector 110 and the power control terminal 1 of the controller 120. The second D+ terminal 20 of the 4 pin USB connector 140 is electrically connected to a connection node between the D+ terminal c of the 5 pin USB connector 110 and the D− control terminal 2 of the controller 120. The second D− terminal 30 of the 4 pin USB connector 140 is electrically connected to a connection node between the D− terminal b of the 5 pin USB connector 110 and the D− control terminal 3 of the controller 120. The second ground terminal 40 of the pin USB connector 140 is electrically connected to a connection node between the ground terminal e of the 5 pin USB connector 110 and the ground control terminal 4 of the controller 120.

As described above, since the USB memory device 100 according to another embodiment of the present invention includes the 4 pin USB connector 140 as well as the 5 pin USB connector 110, the USB memory device 100 is suitably used to the PC as well as the mobile terminal having the 5 pin USB port.

Therefore, the USB memory device 100 according another embodiment of the present invention may be used as a mobile disk in the PC as well as the mobile terminal, and the user may store the data from the mobile terminal and transfer the stored data to the PC.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A universal serial bus (USB) memory device comprising:
at least one five pin USB connector;
a memory to write data received from the five pin USB connector or reading out stored data to transmit the data to the five pin USB connector; and
a controller electrically connected to the five pin USB connector and the memory to control data transmission between the five pin USB connector and the memory,
wherein the five pin USB connector comprises a power terminal, a ground terminal, a D+ terminal, a D− terminal, and an ID terminal, and the ID terminal is connected to the ground terminal so that the five pin USB connector is grounded;
wherein the power terminal of the five pin USB connector is electrically connected to a power control terminal of the controller, the D+ terminal of the five pin USB connector is electrically connected to a D− control terminal of the controller, the D− terminal of the five pin USB connector is electrically connected to a D+ control terminal of the controller, and the ground terminal and the ID terminal of the five pin USB connector are electrically connected to a ground control terminal of the controller, respectively;
at least one four pin USB connector including a second power terminal, a second ground terminal, a second D+ terminal, and a second D− terminal,
wherein the four pin USB connector is electrically connected to the controller so that data transmission from the memory is controlled by the controller.

2. The universal serial bus memory device of claim 1, wherein the four pin USB connector is electrically connected to an electrical connection node between the five pin USB connector and the controller.

3. A method of manufacturing a universal serial bus (USB) memory device, the method comprising:

forming a five pin USB connector including a power terminal transferring Vcc power, a ground terminal transferring a ground signal, a D+ terminal and a D− terminal transferring a data signal, and an ID terminal selectively transferring a client signal and a host signal to an external device, and transferring a signal in such a manner that an external device connected to the five pin USB connector is recognized as a client when the ID terminal is connected to the ground terminal so that the five pin USB connector is open without being connected to a mobile terminal, and transferring a signal in such a manner that the external device connected to the five pin USB connector is recognized as a host when the five pin USB connector is shorted with the mobile terminal;

forming a controller configured to manage data input/output of the memory while controlling an operating system of the portable terminal connected to the five pin USB connector to recognize a USB memory device, and electrically connected to the pin USB connector and the memory to controls data transmission between the five pin USB connector and the memory;

forming a memory configured to write data from the five pin USB connector or read out stored data to transmit the data to the five pin USB connector, freely store or delete data and maintain the data even if power is turned off;

wherein the five pin USB is electrically connected to the controller in such a manner that the power terminal of the five pin USB connector is electrically connected to a power control terminal of the controller, the D+ terminal of the five pin USB connector is electrically connected to a D− control terminal of the controller, the D− terminal of the five pin USB connector is electrically connected to a D+ control terminal of the controller, and the ground terminal and the ID terminal of the five pin USB connector are electrically connected to a five ground control terminal of the controller, respectively;

forming a four pin USB connector including a second power terminal, a second ground terminal, a second D+ terminal, and a second D− terminal, and wherein the four pin USB connector is electrically connected to the controller so that data transmission from the memory is controlled by the controller.

4. The method of claim 3, wherein the controller controls data transmission between the four pin USB connector and the memory or controls the memory to record and store data from the four pin USB connector, the power terminal of the four pin USB connector is electrically connected to a connection node between the power terminal of the five pin USB connector and the power control terminal of the controller, the D+ terminal of the four pin USB connector is electrically connected to a connection node between the D+ terminal of the five pin USB connector and the D− control terminal of the controller, the D− terminal of the 4 pin USB connector is electrically connected to a connection node between the D− terminal of the five pin USB connector and the D− control terminal of the controller, and the ground terminal of the four pin USB connector is electrically connected to a connection node between the ground terminal of the five pin USB connector and the ground control terminal of the controller.

* * * * *